United States Patent [19]

Tranjan et al.

[11] Patent Number: 4,968,582
[45] Date of Patent: Nov. 6, 1990

[54] PHOTORESISTS RESISTANT TO OXYGEN PLASMAS

[75] Inventors: Farid M. Tranjan; Thomas D. DuBois, both of Charlotte; Rudolf G. Frieser, Concord; Stephen M. Bobbio, Wake Forest; Susan K. S. Jones, Durham, all of N.C.

[73] Assignee: MCNC and University of NC at Charlotte, N.C.

[21] Appl. No.: 212,440

[22] Filed: Jun. 28, 1988

[51] Int. Cl.$^5$ .............................................. G03F 7/004
[52] U.S. Cl. ................................... 430/270; 430/191; 430/197; 430/177; 430/271; 430/273; 430/280; 430/281; 430/935
[58] Field of Search ............... 430/177, 178, 179, 191, 430/270, 271, 273, 281, 330, 935, 280, 197; 156/628; 522/18, 28, 75, 76, 64

[56] References Cited

U.S. PATENT DOCUMENTS

| | | |
|---|---|---|
| 3,211,553 | 10/1965 | Ito . |
| 3,585,031 | 6/1971 | Hayes . |
| 4,307,178 | 12/1981 | Kaplan et al. ................. 430/296 |
| 4,415,652 | 11/1983 | Proskow ....................... 430/277 |
| 4,460,436 | 7/1984 | Hiraoka ........................ 156/643 |
| 4,551,418 | 11/1985 | Hult et al. ..................... 430/325 |
| 4,601,969 | 7/1986 | Clecak et al. ................. 430/192 |
| 4,609,614 | 9/1986 | Pampalone et al. ......... 430/323 |
| 4,665,006 | 5/1987 | Sachdev et al. ............. 430/270 |
| 4,678,737 | 7/1987 | Schneller et al. ........... 430/270 |
| 4,696,888 | 9/1987 | Buhr ............................. 430/270 |
| 4,824,763 | 4/1989 | Lee ............................... 430/258 |

FOREIGN PATENT DOCUMENTS 47875  3/1982  Japan ................................ 430/270

OTHER PUBLICATIONS

Thompson et al, Introduction to Microlithography, American Chemical Soc., Washington, DC, 1983, pp. 245–248.
English Translation; Japanese Patent No. 57-47875; Resist Composition; Hiroshi Meno and Takao Kajiware; Date of Publication: 18 Mar. 1982; Date of Application: 2 Sep. 1980.
*VLSI Electronics Microstructure Science*, edited by N. G. Einspruch and D. M. Brown; vol. 8, Plasma Processing for VLSI; Adademic Press, Inc. (1984); pp. 91–98.
*Hawley's Condensed Chemical Dictionary*, Revised by N. I. Sax and R. J. Lewis, Sr., Eleventh Edition; Copyright 1987 by Van Nostrand Reinhold Co., Inc.
*Materials for Microlithography—Radiation-Sensitive Polymers*, Edited by: L. F. Thompson, C. G. Willson and J. M. J. Frechet; American Chemical Society, Washington, D. C. 1984; pp. 49–53.

*Primary Examiner*—Jose G. Dees
*Attorney, Agent, or Firm*—Bell, Seltzer, Park & Gibson

[57] ABSTRACT

The invention is a modified organic photoresist which is resistant to etching in oxygen-containing plasmas and therefore particularly useful for masking and etching organic polymer materials in VLSI and advanced packaging applications. The invention comprises adding a phosphorous-containing compound to a conventional photoresist. The phosphorous-containing compound is of a type and in an amount effective to substantially prevent etching of the modified photoresist in an oxygen-containing plasma without substantially adversely affecting the photosensitivity of the photoresist or the elasticity or the adhesion of the etch resistant film formed during oxygen-containing plasma exposure to an underlying material to be patterned and etched.

21 Claims, 2 Drawing Sheets

PHOTORESISTS RESISTANT TO OXYGEN PLASMAS

FIELD OF THE INVENTION

The present invention relates to photoresist materials used in the patterning and manufacture of semiconductor electronic devices, and in particular relates to a photoresist composition which is effectively resistant to oxygen containing plasmas.

BACKGROUND OF THE INVENTION

The production of miniaturized electronic devices and circuits, commonly referred to as integrated circuits or "chips", includes a number of uncommon manufacturing techniques. The term "chip" often refers to an integrated circuit product having several layers of metallic, insulating or semiconductor materials which have been deposited on, or removed from, a portion of a semiconducting crystalline silicon substrate, all in some predetermined pattern.

As the manufacture of integrated circuits has developed, including the manufacture of very large scale integrated circuits ("VLSI" circuits), the need for adding more devices in smaller spaces has led to the development of photographic and lithographic techniques in such manufacture. For example, in order to form electronic devices in semiconductor materials, insulator materials, and conductive materials (typically metals), a number of very small and yet very precise geometric patterns ("geometries") must be formed in these materials both individually and when they are brought together. Furthermore, production of VLSI circuits typically requires that such patterns extend in three dimensions, specifically between and among various layers of materials.

A present technique for forming geometries in such materials is a patterning technique in which the pattern to be formed in a material is first designed as a mask. A "mask" is a set of images, often fabricated on glass plates and having opaque and transparent parts which represent all, or portions of, the predetermined pattern of semiconductor, metallic or insulating materials, or any combination of these, which is present on, or removed from, a chip.

In many such techniques, the mask is applied to the material to be patterned after the material has been coated with a light sensitive material generally referred to as a photoresist (or sometimes simply a "resist"). As its name implies, the photoresist material is sensitive to light and the material resists particular chemical or physical reactions. This method of patterning is typically termed "contact printing". Even more common today is the use of projection lithography where light is projected through the mask and a lens system onto the wafer surface. Another mechanism for patterning photosensitive materials utilizes electron beam radiation in which a precisely focused beam of electrons is deflected over an electron-beam-sensitive resist film to write patterns without the presence of an intermediate photomask. Still other lithographic methods may employ this resist technology, such as projection of images from masks or reticles and other beam patterning techniques such as laser direct write.

Typical photoresists are solutions of low molecular weight novolac resins, solvents such as propylene glycol methyl ether acetate or 2-ethoxy ethyl acetate, and to which one or more photosensitive compounds such as diazonapthoquinones have been added. Nonvolac resins are the condensation polymers of aldehydes (often formaldehyde) with phenol or with substituted phenols or with both. When the solvents evaporate, a solid photosensitive film remains. Conventional photoresists may also include dyes to prevent the exposing light from undesirably scattering during exposure, as well as other ingredients such as surfactants.

For example, in "contact printing", the patterned mask is applied over the photoresist and the mask and photoresist are exposed to light. The portions of the photoresist which are left uncovered by the mask undergo photochemical reactions which result in characteristics different from the remainder of the photoresist which were covered by the mask and not exposed to the light. When the mask is removed, the chemical differences between the masked and unmasked portions of the photoresist permit one or the other of those portions to be removed in a specified chemical reaction. For example, in a positive acting resist, exposure to light could render the photoresist soluble in a hydroxide base aqueous solution while nonexposure would leave it insoluble. Thus, developing the photoresist in such a solution would remove the exposed portions and leave the nonexposed portions behind. The result is a layer of material yet to be patterned upon which is a layer of patterned photoresist.

The next step is to pattern the material underneath the photoresist, a common technique for which is plasma etching. As known to those familiar with the manufacture of semiconductor devices, in a plasma etching process, a gas is excited by electron impact to produce ions and reactive neutral species. The generated neutral species diffuse out of the plasma to the substrate. There, they react with the substrate to form volatile products. Activation energy for the volatilization reaction may be supplied by ions which are driven out of the plasma to strike the substrate at an angle near 90°. The directional nature of the activation leads to directionality (anisotropy) in the etched profile; i.e. etching occurs in the direction of ion impact rather than equally in all exposed directions. Plasma etching at low pressure and with a considerable amount of ion activation is called reactive ion etching (RIE). Ideally, the plasma exposure should etch away the exposed portions of the underlying material while leaving the portions covered with photoresist unaffected. When the material has been so patterned, the remaining portions of the photoresist can be removed ("stripped") using an appropriate solvent or solution, leaving behind a patterned semiconductor, insulator, or metallic material.

As the scale of integration of semiconductor devices has become larger, meaning in this sense that a larger number of devices are added to a limited amount of space, additional problems and considerations have arisen. For example, in VLSI chips, the number and density of devices requires patterning of many layers of semiconductor material, insulator material and conductors such as metals. In particular, layers of metals must be carefully insulated from one another and typical materials for such insulation purposes now include synthetic polymers, for example polyimides. As just discussed, such polymer materials must be patterned and etched to produce the geometries appropriate for devices and circuits. Oxygen containing plasmas are typical etch environments for patterning such polymeric insulator materials.

A problem arises, however, when an oxygen containing plasma is used to pattern a polymeric insulator, because photoresist materials useful in patterning, as discussed above, are themselves typically organic polymeric materials. As a result, the oxygen containing plasma often has the same effect on the photoresist as it does upon the organic insulating material being patterned. This means that the photoresist will be etched away at approximately the same rate as the insulator material. This results in many situations in which the photoresist fails to protect the intended portions of the insulator material, resulting in an unsatisfactory device or circuit. As is known to those familiar with such circuits, small imperfections basically render such devices or circuits useless.

Several alternative methods for solving this problem have been attempted. A first attempt has been to make the photoresist proportionally thicker than the organic material being etched. If a substantially equivalent amount of both the organic photoresist and the organic insulator are etched in the oxygen plasma, some of the photoresist should remain protecting the insulator as originally intended. A disadvantage arises, however, because increasing the thickness of the photoresist typically decreases the resolution of the pattern, resulting in a poorer definition of geometries and ultimately in lower quality devices.

The so-called "trilayer techniques" represent a second approach for patterning organic insulators using organic photoresist in oxygen plasmas. In these techniques, the insulator to be etched, such as a polyimide, is first covered with a protective barrier layer of an inorganic material such as silicon dioxide ($SiO_2$). The photoresist is then added above the inorganic layer. The photoresist is exposed and developed to form a pattern of geometry in the photoresist. This patterned geometry is then transferred through the inorganic layer using a fluorinated plasma such as a carbon tetrafluoride ($CF_4$) discharge. The pattern formed in the inorganic $SiO_2$ layer forms a secondary inorganic mask which exposes the complementary pattern in the polyimide. Using the secondary inorganic mask, an oxygen plasma etches the polyimide to the desired geometry, while concurrently removing the remainder of the photoresist. The result is a patterned polyimide covered with an identical pattern of $SiO_2$. Accordingly, a second etching step such as a $CF_4$ plasma is required to remove the remaining $SiO_2$ and obtain the desired geometry in the polyimide alone. In other words, typical barrier techniques require three etching steps, as well as an $SiO_2$ deposition step in order to pattern a single layer of insulating material. Each processing step to which the substrate is exposed produces more particle related defects and lowers device yield. Conversely, reduction of the number of these steps increases yield. Furthermore, the use of a secondary masking layer impedes the faithful replication of the original mask dimensions and leads to larger dimensional tolerances.

Other techniques incorporate silicon into the photoresist in some fashion in order to resist the effects of the oxygen plasma. Silicon forms an excellent etch barrier in the presence of the oxygen plasma, but lowers the elasticity and adhesion properties of the photoresist. The photoresist then tends to crack, resulting in undesired exposure and patterning where the cracks occur, and often unacceptably alters the desired geometry. Poorer adhesion properties similarly result in delamination in which photoresist layer tends to peel away from the underlying insulating layer. This also has a detrimental result on geometries and resulting devices.

SUMMARY AND OBJECT OF THE INVENTION

The object of the present invention is to provide a photoresist composition which can be applied to organic insulating materials which are to be etched in oxygen containing plasmas and which photoresist composition will resist itself being etched in those plasmas. Since the process has been simplified by reducing the number of processing steps, the final yield of electronic devices will be greater.

The invention is a modified photoresist composition comprising a mixture of a phosphorous-containing compound and a conventional organic photoresist, and wherein the phosphorous-containing compound is of a type and in an amount effective to resist etching of the modified photoresist in an oxygen containing plasma without adversely affecting the photosensitivity or elasticity of the organic photoresist or the adhesion of the photoresist to an underlying layer of material to be patterned and etched.

The foregoing objects and advantages of the invention and the method of making and using the same will become more readily apparent from the detailed description taken in conjunction with the accompanying drawings in which:

DETAILED DESCRIPTION

Figure 1:
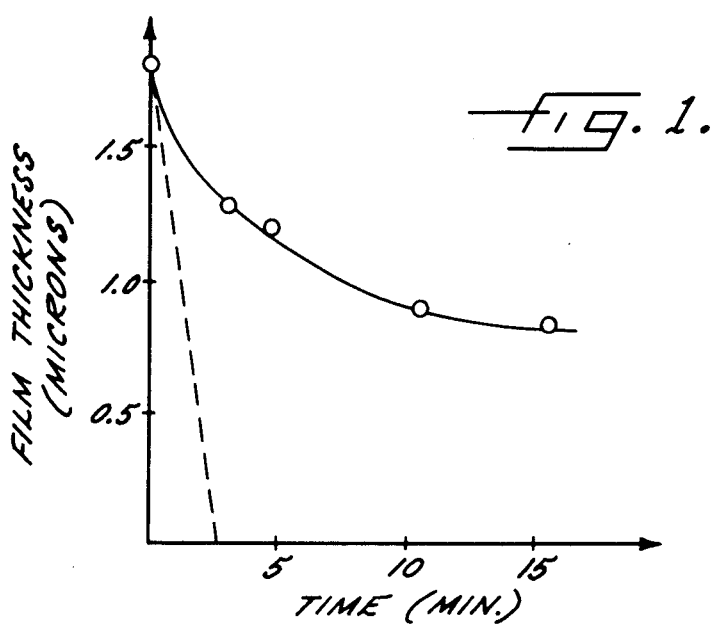
FIG. 1 is a plot of film thickness versus time showing the performance of the modified resist in comparison to unmodified resist when exposed to an oxygen containing plasma.

The present invention comprises a modified photoresist that is a mixture of an otherwise conventional organic photoresist, such as the Shipley 1400 series photoresist available from Shipley, 2300 Washington Street, Newton, Massachusetts 02161, and a phosphorous containing compound of a type and in an amount effective to substantially prevent etching of the composition in an oxygen containing plasma without substantially adversely affecting other desirable properties of the photoresist. Specifically, it has been discovered according to the present invention that a number of phosphorous compounds, when added to otherwise conventional photoresists, make those photoresists resistant to etching in oxygen containing plasmas.

As used herein, the phrase "resistant to etching" means that the modified photoresist of the present invention is resistant enough to the effects of an oxygen containing plasma that a sufficient amount of an etch resistant film will be formed and remain during the etching process to protect all of the intended patterned areas. Some etching of the modified resist may take place, but at a far lesser rate than the etching of the underlying layer of organic material.

An appropriate photoresist, however, must meet a number of performance requirements in addition to resistance to etching in a particular plasma. Typically, an appropriate photoresist requires a proper photosensitivity, resistance to etching, exposure threshold, contrast, elasticity, and adhesion.

Such properties of photoresists are, however, very sensitive to chemical change,, or to the addition of other materials to the solution. It has been discovered according to the present invention, however, that the phosphorous compounds of the present invention do not adversely affect these various aspects of the photoresist.

For example, as known to those familiar with such materials, the exposure sensitivity of a resist represents the amount of energy required to produce the requisite dose to complete solubility in the exposed regions, while not appreciably affecting the unexposed resist. A typical exposure sensitivity is 90–100 millijoules per square centimeter ($mJ/cm^2$) for a 1.5 micron thickness of material. The process of the present invention changes the exposure sensitivity of typical resists from about 90–100 $mJ/cm^2$ to about 140 $mI/cm^2$. This decrease in sensitivity does not, however, affect the other functional properties of the photoresists.

The resolution of a photoresist refers to the definition or precision in resulting geometries when the photoresist is patterned and developed. It has been discovered according to the present invention that the resolution properties of the modified photoresist appear to be unchanged.

The elasticity of the etch resistant film formed in the early stages of oxygen containing reactive ion etching plasma exposure is presently extremely difficult to quantify or otherwise determine in the absence of extremely sophisticated equipment. A lack of elasticity, however, tends to exhibit itself as cracking of the masking layer at stress points (such as inside corners) of the developed geometries. Therefore, the presence of cracking indicates a lack of sufficient elasticity, while an absence of cracking is a good indication of an appropriate elasticity in the materials. There has been no observed cracking for the films of this invention.

Adhesion represents the degree to which the etch mask remains fixed to the layer to be patterned and etched. A lack of adhesion is indicated by observable delamination; i.e. a peeling away of the etch mask from the underlying layer to be etched. Whenever a film delaminates, the areas masked by the film become undesirably exposed during the etching process and fail to become correctly patterned. In the preferred embodiments of the modified photoresist of the present invention, no delamination has been observed to date.

In preferred embodiments of the invention, it has been discovered that the phosphorous containing compound must be present in an amount such that the resulting modified photoresist composition is above 2 percent by weight phosphorous based on the total mass of the resist, excluding solvents. The upper limit of the amount of the phosphorous containing compound or compounds which should be added is defined by the solubility of the phosphorous containing compound in the unmodified photoresist solvent system, as well as by any possible disadvantageous alterations of the functional properties of the photoresist.

The particular percentage of phosphorous in the resist, however, is preferably adjusted depending upon the materials to be etched and the particular etching conditions. Patterned films of the modified photoresists have proved to be satisfactory etch masks for underlying polyimide layers which are as thick as 8 micrometers (1 micrometer = $10^{-6}$ meter).

In determining the resistance of a photoresist to etching, absolute measurements can be meaningless as etching conditions can vary widely. An appropriate method of determining the satisfactory behavior of such a photoresist, however, is the differential etch rate; i.e. the difference between the etch rate observed in an oxygen plasma for a modified resist and the etch rate observed for an unmodified resist.

FIG. 1 is the plot of a comparison between a photoresist modified according to Example 1 herein and a corresponding unmodified photoresist. The solid line represents the film thickness remaining after etching for the times shown on the abscissa. The dashed line shows the same result for unmodified resist.

Further to the present invention, however, it appears that a barrier film resistant to oxygen containing plasma etch eventually forms on the modified photoresist at which point the etch rate approaches a limit at which etching of the photoresist proceeds no further, and the etch rate becomes undetectable by conventional techniques. In FIG. 1, this is exhibited as the levelling off of the film thickness at about 0.8 micrometers after about 10 minutes of etching, which represents a decrease in the thickness of the resist by approximately a factor of two when phosphorous is present in an amount of about 10 percent.

The modified photoresists of the present invention exhibit excellent shelf lives, even after mixing with the phosphorous containing compounds. Typical photoresist compositions with which the present invention has been found to be useful include polydimethylglutarimide, crosslinked novolac resins, and thermosetting polyesters, as well as polyimides. The modified photoresist is prepared by calculating the weight percentage of phosphorous in the phosphorous containing compound and then adding sufficient compound to a photoresist to obtain the desired weight percent of phosphorous based on the weight of solids in the photoresist; i.e. excluding the weight of the solvents in the unmodified resist.

In preferred embodiments of the present invention, the phosphorous containing compound comprises phosphonitrilic chloride trimer ($P_3N_3Cl_6$) or tetramer ($P_4N_4Cl_8$) or phosphates, for which the preferred embodiment comprises trimethyl phosphate (($CH_3O)_3PO$). In other preferred embodiments, mixtures of phosphonitrilic chloride trimer, tetramers or phosphates are suitable as well, provided that the appropriate weight percentage of phosphorous in the total photoresist is maintained.

In another embodiment, the phosphorous containing organic compound comprises triphenyl phosphene oxide, (($C_6H_5)_3PO$). Although applicant does not wish to be bound by any particular theory, it is possible that some of the phosphorous-containing compounds polymerize to some extent under the attack of the oxygen plasma and form a film that includes phosphorous in its maximum oxidation state (+5) and that has a high enough molecular weight to avoid being easily sputtered away in the plasma. Other potential theories include the possibility that the phosphate compounds link to the phenolic groups in the photoresist to form a polymeric barrier to further oxygen etching. Nevertheless, the difference in structure and hypothetical chemical activity of the phosphorous compounds which have been found to successfully form the modified photoresist of the invention indicate that the phosphorous is the factor preventing etching in the oxygen plasma.

Appropriate phosphorous compounds must be maintained in the photoresist during baking processes. As known to those familiar with such processes, baking is a typical preparation technique for photoresists prior to etching. The baking process helps drive off solvent and is generally considered a curing step for the polymeric photoresist. Typical bake techniques include maintaining the photoresist at 80 to 100 degrees for about 1.0 minutes in a hot chuck, or about 30 minutes in a convection oven.

To be most useful, photoresists should maintain other appropriate properties during application, and those of the present invention have been found to be most satisfactory in this regard. For example, in the spin application technique, approximately one milliliter of photoresist is applied at the center of a wafer which is being spun at relatively high speeds, for example 3000-4000 rpm. This spinning technique leaves a film of about 1.5 micron thickness on the wafer. The thickness can, however, be adjusted by adjusting the speed at which the wafer is rotated and the viscosity of the photoresist or both.

The modified photoresist of the present invention can also be applied using other techniques such as vapor deposition, immersion, or vapor reflux. In vapor deposition, the photoresist is exposed to a vapor which contained the phosphorous-containing compound so that vaporized molecules of the phosphorous containing compound interact directly with the photoresist. In immersion techniques, the photoresist layer (often as part of a wafer of material) is immersed in a heated bath of solvents and the phosphorous containing compound as its name implies. In vapor reflux, the photoresist laYer is exposed to the evaporated gases from a liquid source material which contains the phosphorous-containing compound. These gases condense as liquids on the photoresist layer and then tend to drop back into the liquid source material.

It has been discovered according to the present invention that these filming properties of photoresist modified according to the present invention are quite favorable, namely they spread in the uniform thickness across the wafer. The invention does not affect the uniformity, but has been observed to affect the viscosity by both increasing it or lowering it depending upon the particular compound used.

The preferred embodiments of the modified resists of the present invention remain soluble after etching in commercially available stripping solutions such as the Accustrip photoresist stripping solution available from the General Chemical Corporation, Morristown, NJ 07960.

The invention can be used to produce wafers of semiconductor materials which have one or more materials thereon which together define devices and device precursor geometries. Such wafers can be patterned and used in a formation of semiconductor electronic devices by exposing the phosphorous containing photoresist material to be patterned to light of a frequency and intensity sufficient to cause photochemical reactions to proceed throughout the bulk of the exposed portions of the resist film, following which the resist film can be developed into the desired removed and unremoved portions corresponding to the pattern of the mask. By exposing the underlying material patterned with phosphorous containing resist film to an oxygen containing plasma, the resulting desired geometries can be transferred to the underlying material.

As used throughout this disclosure, the term "oxygen containing plasma" means any plasma comprised of the following: 1) a mixture of: one or more oxygen containing source gases (such as $O_2$, $N_2O$, $NO$, $NO_2$, $N_2O_4$, $CO$, $CO_2$, $SO_2$ or $H_2O$ vapor) with one or more diluent gases (such as $N_2$ or an inert gas) in any ratio whatever; or 2) a mixture as described in 1) together with a fluorine containing gas or gas mixture (comprised, for example, of $SF_6$ or $CF_xCl_{4-x}$, where x is equal to or less than 4, but greater than 0) where oxygen is in manifest abundance, that is where the ratio of oxygen atoms to fluorine atoms in the mixture is greater than 4.

Similarly, there are a number of additional methods of exposing the modified resist material. These include projecting lens and reticle systems, electron beams, ion beams, and scanned light beams, all of which can be used in accordance with the present invention.

Additionally, the phosphorous-containing compound can be added to the photoresist at different stages in the overall patterning process. As just discussed, in the preferred embodiment the phosphorous-containing compound is added to the resist before any application, patterning or developing steps take place. The phosphorous containing compound can also be added following application of the resist, but before any patterning or developing steps. In another embodiment, the unmodified resist can be masked and exposed to light, following which the resist may be modified by adding the phosphorous-containing compound. In such a technique the exposure to the oxygen-containing plasma acts to both develop the pattern in the resist and to etch the underlying material.

In yet another embodiment, the photoresist can be masked and photoexposed, then conventionally developed, then modified by addition of the phosphorous-containing compound, and finally exposed to the oxygen-containing plasma.

EXAMPLE 1

Approximately 2.2 grams (g) of phosphonitrilic chloride trimer were added to 20.0 milliliters (ml) of Shipley S1400-31 photoresist, in order to obtain a mixture in which the nonvolatile components were about 10% phosphorous, by weight. The mixture was agitated thoroughly until all of the solids dissolved and then was pressure-filtered through a 0.5 micron filter, thereby avoiding loss of solvent during the filtration process. A wafer carrying a 4.5 micron layer of polyimide was flooded with the resulting filtrate and then spun at 4000 rpm for 40 seconds to thoroughly distribute the modified resist. The wafer was then soft-baked at 80° C. for 20 minutes to cure the resist. The wafer was then masked and exposed to a dose of 160 mJ/cm$^2$ and developed for 46 seconds with a conventional low-metal ion developer (Shipley MF-312) suitable for the 1400 series photoresist.

FIG. 1 shows the etch characteristics of this modified resist. The etch tool was a high rate magnetron system designed and developed at the Microelectronics Center of North Carolina, and described by S. M. Bobbio and Y. S. Ho in Proc. 6th Symp. on Plasma Etching, Electrochem. Soc., 47 (1987). A flow of 50 sccm $N_2$ and 10 sccm $O_2$ at 1200 watts gave an etch rate on polyimide of approximately 7000 angstroms per minute.

Figure 2:
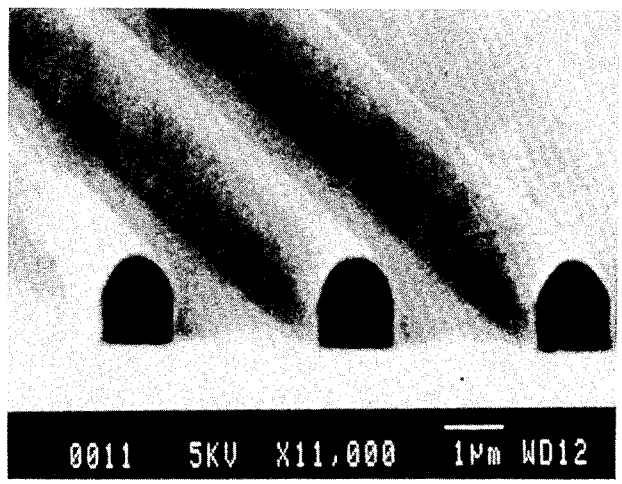
FIG. 2 is a photograph of the exposed and developed photoresist of the present invention over polyimide.
Figure 3:
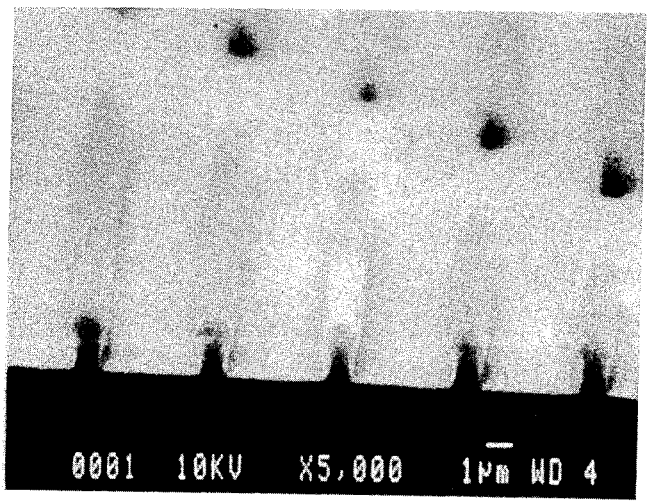
FIG. 3 is a photograph of the photoresist of FIG. 2 following etching.

FIGS. 2 and 3 show the modified photoresist of the invention before and after etching. FIG. 2 shows the exposed and developed resist over polyimide prior to etching, and FIG. 3 shows the resist and polyimide after etching. In the scale of FIG. 3, about 0.8 microns of resist remain after etching, over about 1.3 microns of polyimide.

Figure 4:
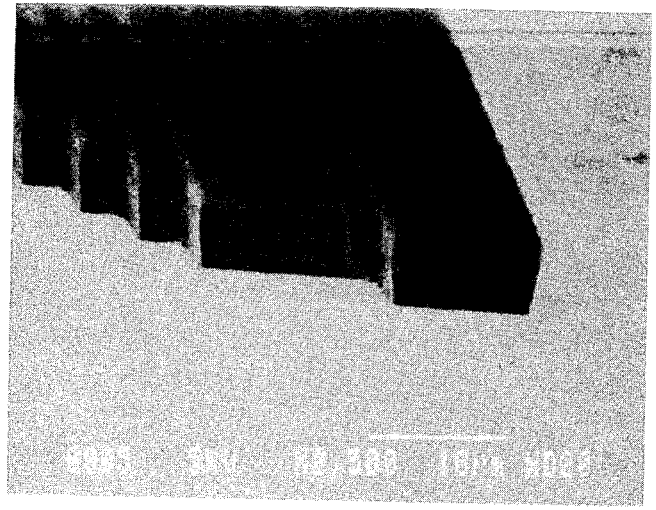
FIG. 4 is another photograph showing the modified resist and resulting polyimide pattern after a 100 percent overetch of a much thicker polyimide layer than the one shown in FIG. 3.

FIG. 4 is another micrograph of the modified resist and resulting polyimide pattern after a 100% overetch of a much thicker polyimide layer (approximately 4.5 microns).

EXAMPLE 2

A modified photoresist was prepared using the techniques of Example 1 with the exception that 1.1 grams of phosphonitrilic chloride trimer were used to obtain a mixture in which the solid components were about 5% phosphorous by weight. This modified resist was quite satisfactory for etching organic layers which were up to about 3.5 microns thick.

EXAMPLE 3

A modified photoresist was prepared according to the techniques of Example 1 with the exception that 2.7 milliliters of trimethyl phosphate were mixed with 20 milliliters of Shipley resist to obtain a 10% concentration of phosphorous in the solid portion of the modified resist. The resulting photoresist performed substantially the same as the modified photoresists of Examples 1 and 2.

OTHER COMPOUNDS

A number of other phosphorous-containing compounds have been demonstrated to be etch resistant in accordance with the present invention. These include trimethyl phosphate, triphenyl phosphate, triphenyl phosphene oxide, phosphorous pentachloride, trishydroxymethyl phosphine oxide, and phosphorous oxychloride. These compounds all demonstrate resistance to etching and are more or less preferred on the basis of the other properties required, namely resolution, elasticity and adhesion.

In the specification and drawings, there have been set forth preferred and exemplary embodiments of the invention which have been set forth by way of example and not by way of limitation, the scope of the invention being set forth in the following claims.

That which is claimed:

1. A method of forming a modified photoresist composition which is resistant to etching in oxygen-containing reactive ion etching plasmas, the method comprising admixing an organic photoresist with a phosphorus-containing compound of a type and in an amount effective to substantially prevent etching of the composition in an oxygen-containing reactive ion etching plasma without substantially adversely affecting the photosensitivity of the organic photoresist or the elasticity of adhesion of the etch resistant film formed during oxygen-containing reactive ion etching plasma exposure to an underlying material to be patterned and etched.

2. A method according to claim 1 further comprising applying the modified photoresist composition to a layer of organic insulating material which is to be patterned using the modified photoresist composition.

3. A method according to claim 1 wherein the step of applying the photoresist composition comprises a spin-on application technique.

4. A method according to claim 1 further comprising heating the photoresist composition for a time and at a temperature sufficient to cure the photoresist composition.

5. A method of forming a modified photoresist composition which is resistant to etching in oxygen-containing reactive ion etching plasmas, the method comprising:

applying a layer of an organic photoresist upon a layer of material which is to be patterned by being etched in an oxygen-containing reactive ion etching plasma; and applying a phosphorus-containing compound to the layer of organic photoresist, and wherein the phosphorus containing compound is of a type and in an amount effective to substantially prevent etching of the organic photoresist in an oxygen-containing reactive ion etching plasma without substantially adversely affecting the photosensitivity of the organic photoresist or the elasticity or the adhesion of the etch resistant film formed by oxygen-containing reactive ion etching plasma exposure to the underlying material to be patterned and etched.

6. A method according to claim 5 wherein the step of applying the phosphorus-containing compound is selected from the group consisting of: spin-on application, vapor deposition, immersion, or vapor reflux techniques.

7. A modified photoresist composition which is resistant to etching in oxygen-containing reactive ion etching plasmas, the composition comprising a mixture of:
   (a) an organic photoresist; and
   (b) a phosphorus-containing compound of a type and in an amount effective to substantially prevent etching of said composition in an oxygen-containing reactive ion etching plasma without substantially adversely affecting the photosensitivity of said organic photoresist or the elasticity or adhesion of said composition to an underlying material to be patterned and etched during exposure to an oxygen-containing reactive ion etching plasma.

8. A photoresist composition according to claim 7 wherein said organic photoresist is a positive acting photoresist.

9. A photoresist composition according to claim 7 wherein said organic photoresist is a negative acting photoresist.

10. A photoresist composition according to claim 7 wherein said phosphorous-containing compound is present in an amount of between about 2 percent by weight phosphorous based on the total weight of solids in said mixture and an amount that forms a saturated solution of said phosphorous-containing compound in said organic photoresist.

11. A photoresist composition according to claim 7 wherein said phosphorous-containing compound is selected from the group consisting of phosphonitrilic chloride trimers and phosphonitrilic chloride tetramers and mixtures thereof.

12. A photoresist composition according to claim 7 wherein said phosphorous-containing compound comprises a phosphate.

13. A photoresist composition according to claim 7 wherein said phosphorous-containing organic compound comprises trimethyl phosphate.

14. A photoresist composition according to claim 7 wherein said phosphorous-containing compound comprises triphenyl phosphine oxide.

15. A photoresist composition according to claim 7 wherein said phosphorous-containing compound is selected from the group consisting of tetramethyl phosphate, triphenyl phosphate, triphenyl phosphine oxide, phosphorous pentachloride, trishydroxymethyl phosphine oxide, and phosphorous oxychloride.

16. A photoresist composition according to claim 1 wherein said organic photoresist comprises a novolac resin and a photosensitizer.

17. A photoresist composition according to claim 7 wherein said organic photoresist comprises a condensation polymer of phenol and formaldehyde and a photosensitizer.

18. A modified photoresist composition for being applied to a layer of material to be etched in a reactive ion etching plasma, and that is resistant to etching in oxygen-containing reactive ion etching plasmas when cured, said modified photoresist comprising a solution of nonvolatile photoresist-forming organic compounds in an organic solvent system wherein the nonvolatile compounds are curable into a solid photoresist, said nonvolatile compounds comprising at least about 2 percent by weight phosphorus.

19. A modified photoresist composition for being applied to a layer of organic material to be etched, and that is resistant to etching in oxygen-containing reactive ion etching plasmas when cured, said modified photoresist comprising a solution of a nonvolac resin, photosensitizers, and a phosphorus-containing compound in a solvent, and wherein said phosphorus-containing compound is present in an amount such that phosphorus is present in an amount of about 10 percent by weight of the total weight of said nonvolac resin said photosensitizers, and said phosphorus-containing composition.

20. A modified photoresist composition according to claim 19 wherein said phosphorus-containing compound is selected from the group consisting of phosphonitrilic chloride trimer, phosphonitrilic chloride tetramer, and mixtures thereof.

21. A modified photoresist composition according to claim 19 wherein said phosphorus-containing compound comprises trimethyl phosphate.

* * * * *